(12) United States Patent
Wang et al.

(10) Patent No.: US 8,084,688 B2
(45) Date of Patent: Dec. 27, 2011

(54) ELECTRONIC DEVICE

(75) Inventors: Jun Wang, Shenzhen (CN); Chen-Li Kao, Taipei Hsien (TW); Chien-Ming Chih, Taipei Hsien (TW); Deng-Zhong Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 247 days.

(21) Appl. No.: 12/641,602

(22) Filed: Dec. 18, 2009

(65) Prior Publication Data

US 2011/0096473 A1  Apr. 28, 2011

(30) Foreign Application Priority Data

Oct. 26, 2009 (CN) .......................... 2009 1 0308832

(51) Int. Cl.
*H02G 3/08* (2006.01)

(52) U.S. Cl. ......... 174/50; 174/17 R; 439/535; 248/906; 361/600

(58) Field of Classification Search ............... 174/50, 174/17 R; 439/535; 248/906; 361/600; 220/4.02
See application file for complete search history.

(56) References Cited

U.S. PATENT DOCUMENTS 7,816,603 B2 * 10/2010 Nowakowski ............... 174/50
7,825,334 B2 * 11/2010 Chien ............................ 174/50
7,843,684 B2 * 11/2010 Lu et al. .................. 361/679.47

* cited by examiner

*Primary Examiner* — Dhiru R Patel
(74) *Attorney, Agent, or Firm* — Altis Law Group, Inc.

(57) ABSTRACT

An electronic device includes a first housing, a second housing, and a sealing member. The first housing has a first sidewall, and the second housing has a second sidewall. The sealing member is positioned between the first housing and the second housing. The first sealing member is elastic, and defines a first assembly groove and a second assembly groove. The first sidewall is engaged in the first assembly groove and tightly attached to the sealing member. The second sidewall is engaged in the second assembly groove and tightly attached to the sealing member.

14 Claims, 6 Drawing Sheets

ELECTRONIC DEVICE

BACKGROUND

1. Technical Field

The present disclosure relates generally to electronic devices and, more particularly, to an electronic device with waterproof capability.

2. Description of Related Art

An electronic device includes a plurality of inner electronic components therein. Such electronic devices frequently utilize a soft plastic outer housing preventing water and dust from entry, thereby avoiding damage to the inner electronic components. However, the outer housing is typically detachably sleeved on the electronic device, with a gap between the outer housing and the electronic device. Accordingly, the outer housing cannot thoroughly prevent water and dust from entry.

In order to effectively protect the inner electronic components, waterproof glue is applied to a connecting portion of different parts of the electronic device, such that water and dust cannot enter in the electronic device. However, if the inner electronic components require repair, the original waterproof glue is removed to provide access. After completion of the repair, waterproof glue must be reapplied or protection is no longer assured.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
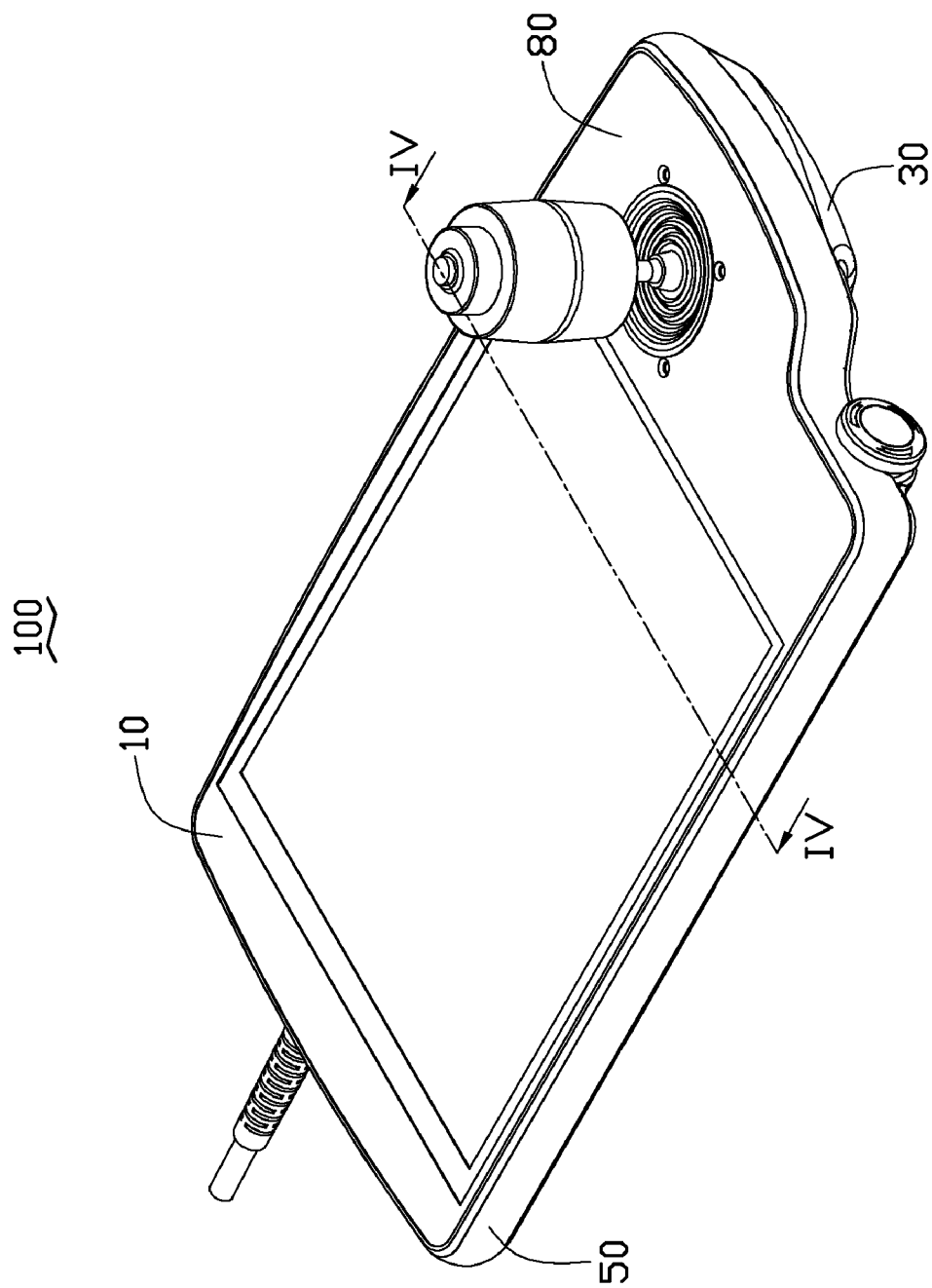
FIG. 1 is an isometric view of an embodiment of an electronic device, the embodiment device including a first sealing member.

Referring to FIG. 1, an embodiment of an electronic device 100 includes a first housing 10, a second housing 30, a first sealing member 50 positioned between the first housing 10 and the second housing 30, and a second sealing member 80 attached to the first housing 10. A display 70 is positioned on the first housing 10. In the illustrated embodiment, the electronic device 100 is a teaching pendant, for exemplary purposes.

Figure 2:
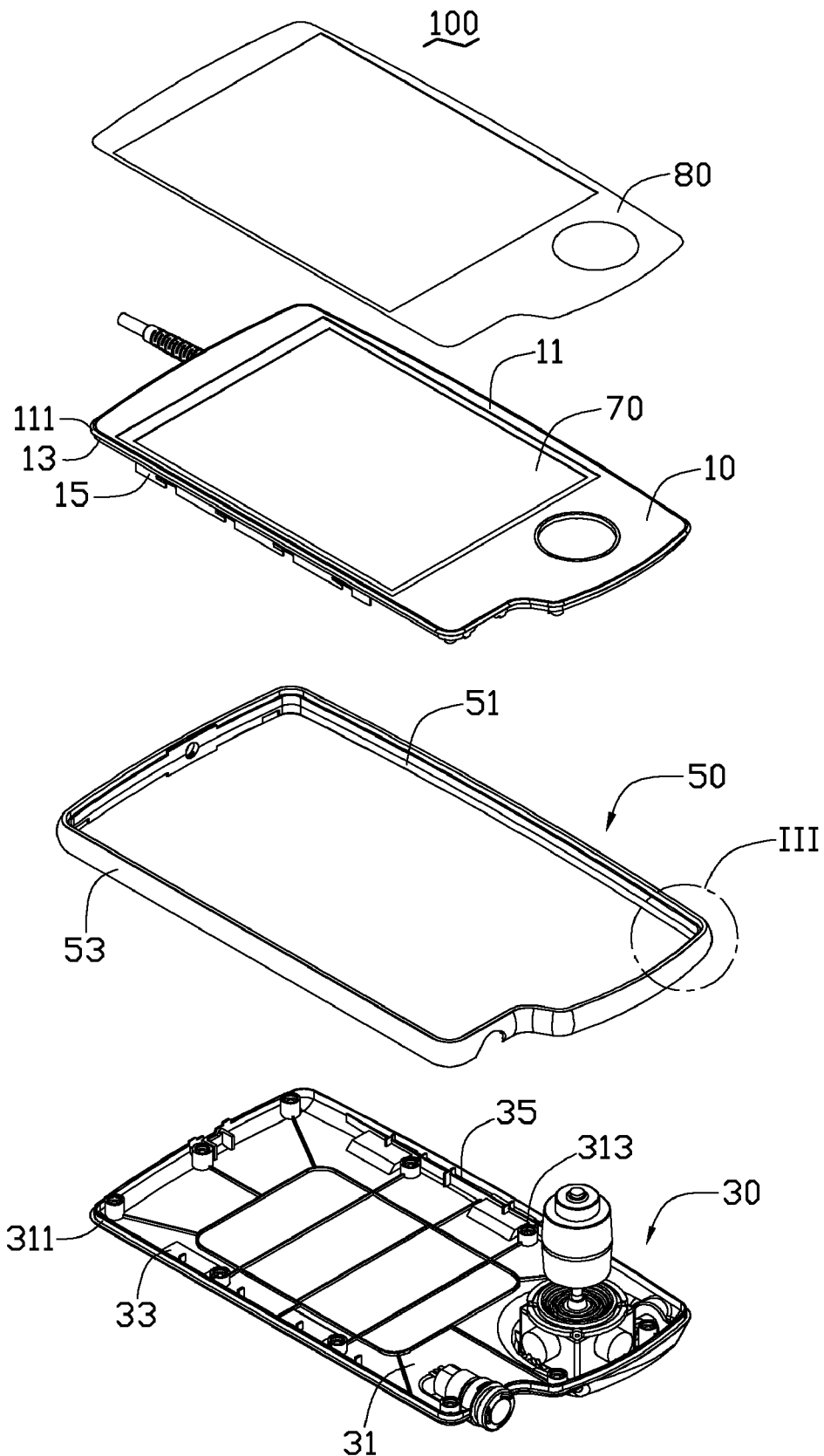
FIG. 2 is an exploded, isometric view of the electronic device of FIG. 1.
Figure 3:
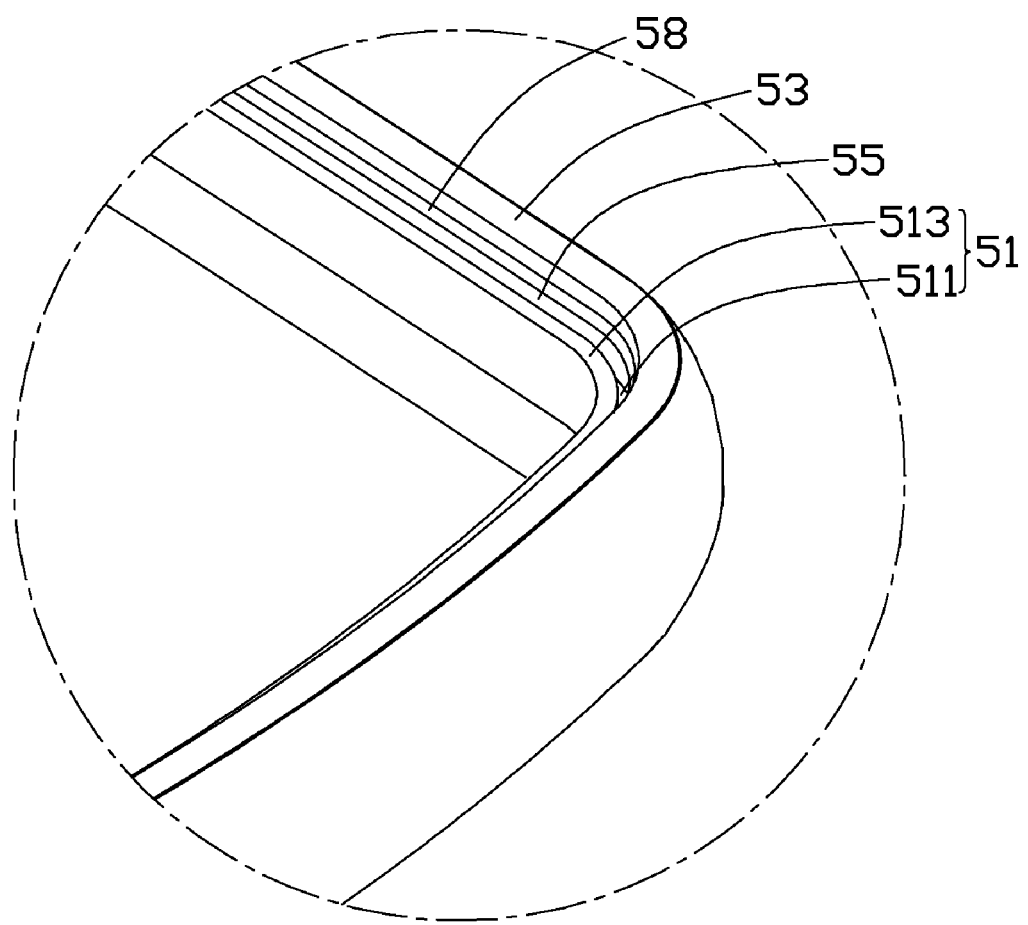
FIG. 3 is an enlarged view of a part III of FIG. 2.
Figure 4:
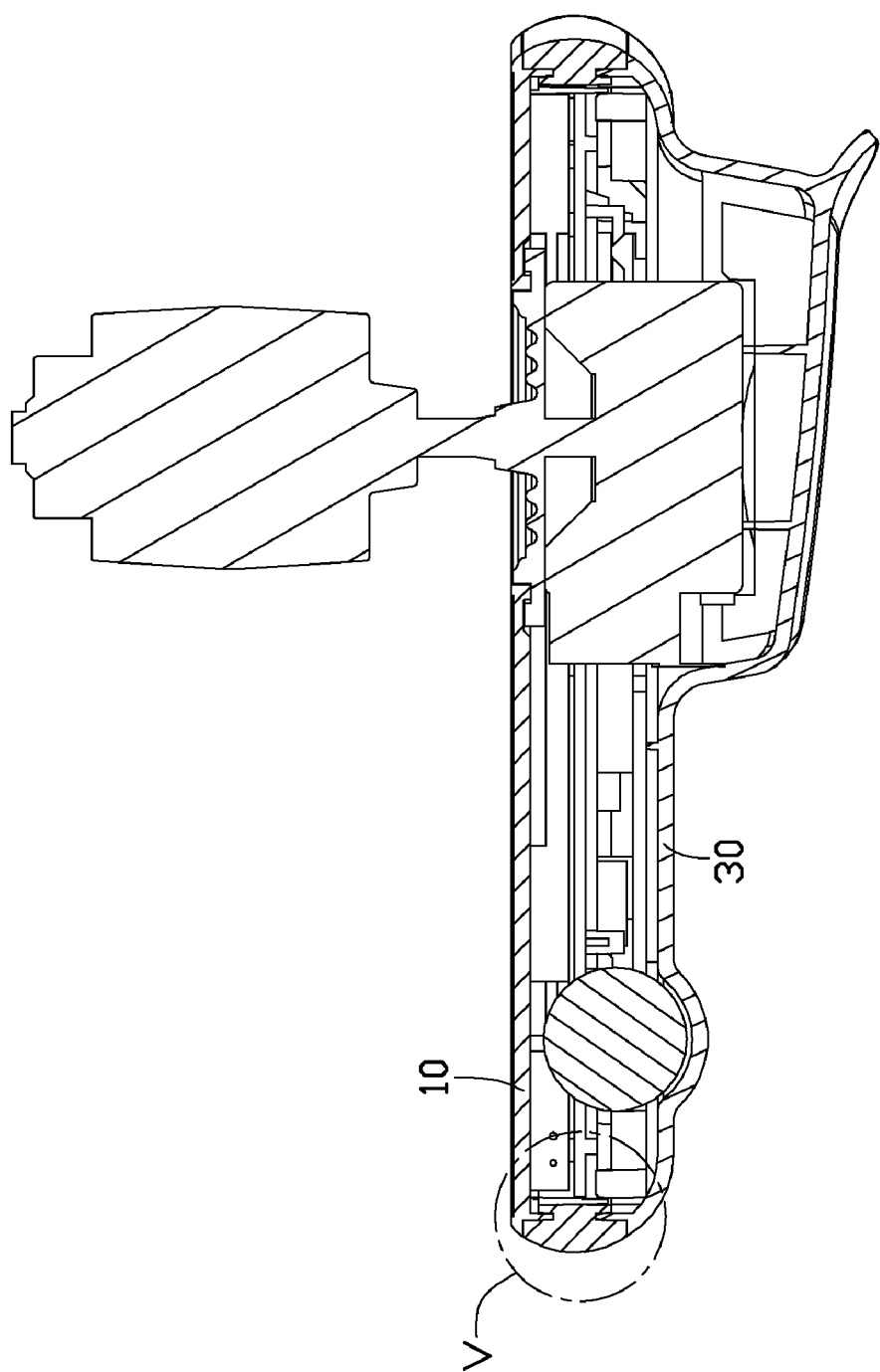
FIG. 4 is a cross-section of the electronic device of FIG. 1, taken along line IV-IV.

Referring to FIGS. 1 and 2, the first housing 10 includes a first bottom wall 11, a first sidewall 13, and an engaging portion 15. The first sidewall 13 extends from an edge of the first bottom wall 11. The engaging portion 15 also extends from the first bottom wall 11 and is adjacent to the first sidewall 13. The first bottom wall 11 has a first flange 111, and the first flange 111 has a curved outer surface. The first bottom wall 11 defines a plurality of threaded holes (not shown).

The second housing 30 includes a second bottom wall 31 and a second sidewall 33 extending from an edge of the second bottom wall 31. The second bottom wall 31 has a second flange 311, and the second flange 311 has a curved outer surface. The second bottom wall 31 defines a plurality of threaded holes 313.

Referring to FIGS. 2 through 5, the first sealing member 50 is annular and encircles the first housing 10 and the second housing 30. The first sealing member 50 can be made of an elastic material. In the illustrated embodiment, the first sealing member 50 is made of plastic. The first sealing member 50 includes a first sealing portion 51 and a second sealing portion 53. The first sealing portion 51 and the second sealing portion 53 cooperatively define a first assembly groove 55 and a second assembly groove 57. The first sealing portion 51 includes a connecting protrusion 511 and a positioning flange 513. The connecting protrusion 511 extends from a middle portion of the second sealing portion 53. The positioning flange 513 is formed on an end of the connecting protrusion 511 away from the second sealing portion 53. The connecting protrusion 511 separates the first assembly groove 55 from the second assembly groove 57. A width C of the first assembly groove 55 in a normal state is less than a thickness T of the first sidewall 13. A width D of the second assembly groove 57 in a normal state is less than a thickness B of the second sidewall 33. The second sealing portion 53 has a curved outer surface 531.

Figure 5:
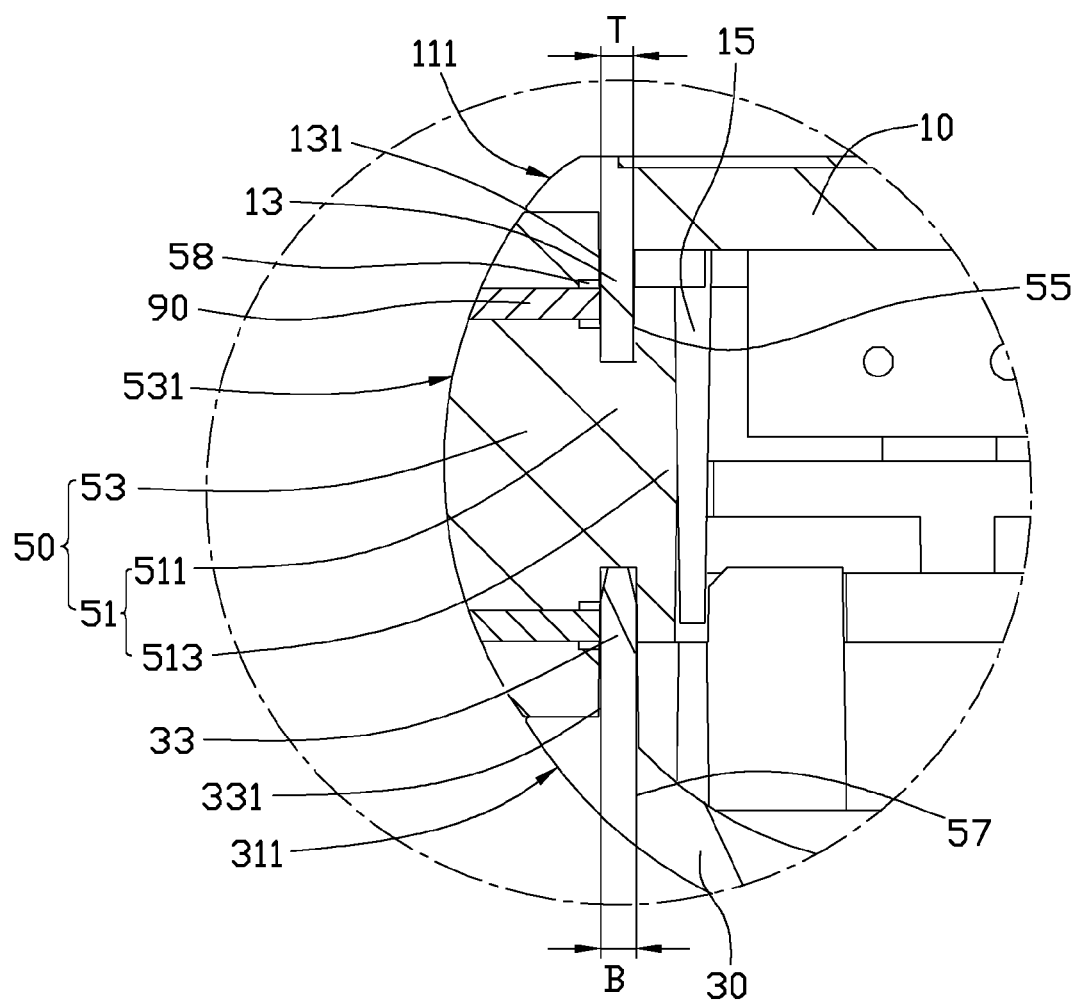
FIG. 5 is an enlarged view of a part V of FIG. 4.
Figure 6:
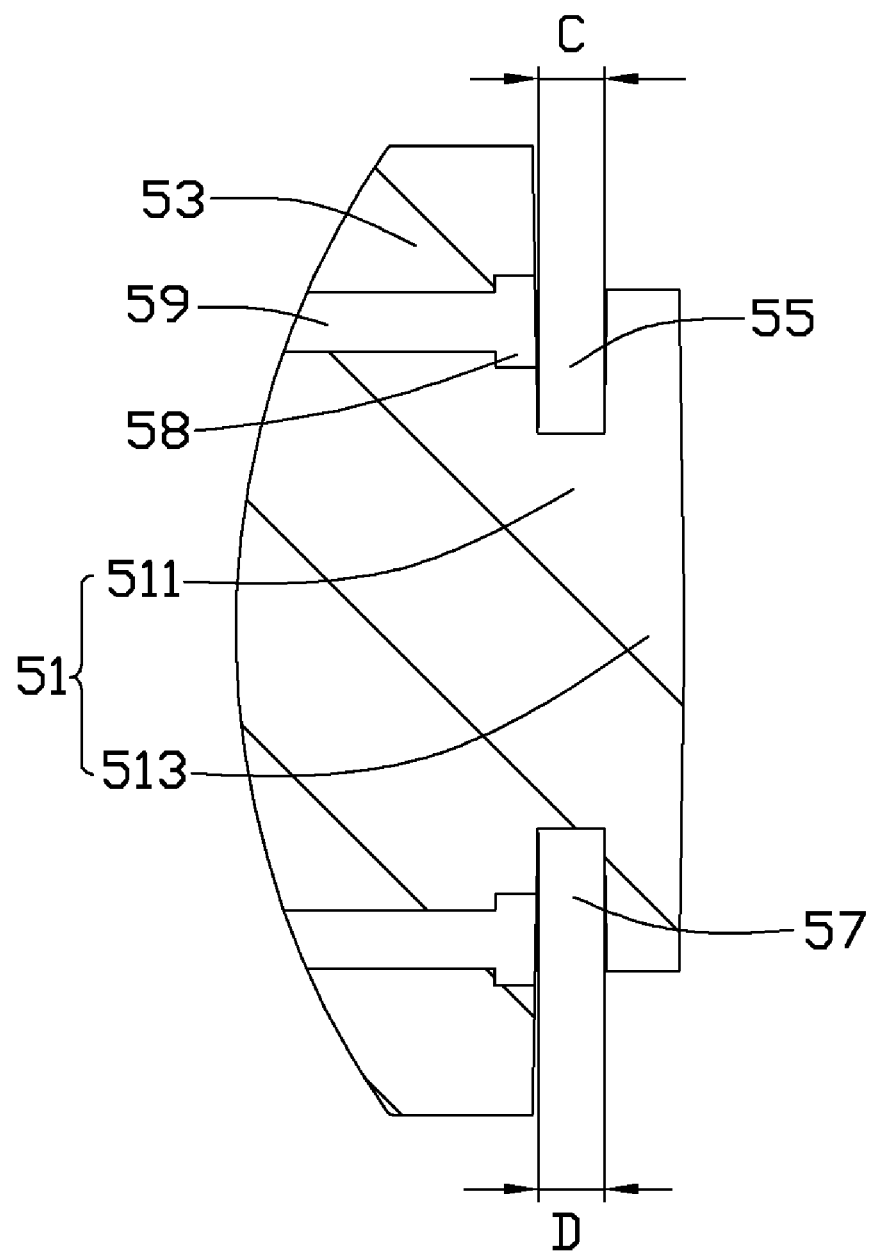
FIG. 6 is a cross-section of the first sealing member of FIG. 1.

Referring to FIGS. 5 and 6, the second sealing portion 53 defines one or more annular guide grooves 58 in an inner surface opposite to the positioning flange 513, and one or more connecting holes 59 in an outer surface communicating with the guide grooves 58. The second sealing portion 53 includes one or more sealing plugs 90 engaging with the connecting holes 59. In the illustrated embodiment, the second sealing portion 53 defines two substantially parallel guide grooves 58 and two substantially parallel connecting holes 59 communicating with the guide grooves 58. One of the guide grooves 58 communicates with the first assembly groove 55, and the other guide groove 58 communicates with the second assembly groove 57.

The second sealing member 80 is a sealing film in this embodiment. The second sealing member 80 is ultrasonically welded to the first housing 10, thus enveloping the display 70.

Referring to FIGS. 2, 5 and 6, in assembly of the electronic device 100, the first sidewall 13 of the first housing 10 is engaged in the first assembly groove 55 of the first sealing member 50. The second sidewall 33 of the second housing 30 is engaged in the second assembly groove 57 of the first sealing member 50. The first sidewall 13 is tightly attached to the second sealing portion 53 and the positioning flange 513, due to the width C of the first assembly groove 55 in the normal state being less than the thickness T of the first sidewall 13. The second sidewall 33 is also tightly attached to the second sealing portion 53 and the positioning flange 513, because the width D of the second assembly groove 57 in the normal state is less than the thickness B of the second sidewall 33. A plurality of fasteners, such as screws, extend through the threaded holes 313 of the second housing 30, and engage with the threaded holes of the first housing 10, thus firmly fixing the second housing 30 to the first housing 10. The first sidewall 13 resists an innermost end of the first assembly groove 55, and the second sidewall 33 resists an innermost end of the second assembly groove 57.

After the electronic device 100 is assembled, both the first sidewall 13 and the second sidewall 33 are sealed by the first sealing member 50, thus preventing dust and water from contaminating the interior of the electronic device 100. The engaging portion 15 is tightly attached to the positioning flange 513. In addition, the first sidewall 13 can be easily and smoothly assembled in the first assembly groove 55, and the second sidewall 33 can also be easily and smoothly assembled in the second assembly groove 57, because the first sealing member 50 is made of an elastic material. There is no gap between the first sidewall 13 and the first sealing member 50, and between the second sidewall 33 and the first sealing member 50. Furthermore, the first flange 111 of the first bottom wall 11, the second flange 311 of the second bottom wall 31, and the second sealing portion 53 have curved outer surfaces to smoothly connect with each other, presenting a favorable appearance.

Over a long period of time and use, a gap may form between the first housing 10 and the second housing 30, possibly allowing entry of moisture. However, in such a case, the sealing plugs 90 can be withdrawn from the first sealing member 50, thus water in the electronic device 100 can flow in the guide grooves 58, and out of the electronic device 100 via the connecting holes 59. It should be pointed out that the guide grooves 58 may be angled such that moisture flows easily out of the electronic device 100.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device, comprising:
a first housing having a first sidewall; a second housing having a second sidewall; and a first sealing member positioned between the first housing and the second housing,
Primary Examiner, Art Unit 2835 wherein the first sealing member is elastic and comprises a first sealing portion and a second sealing portion connecting with the first sealing portion, the first sealing portion and the second sealing portion cooperatively defining the first assembly groove and the second assembly groove, the first sidewall is engaged in the first assembly groove and tightly attached to the first sealing member, and the second sidewall is engaged in the second assembly groove and tightly attached to the first sealing member.

2. The electronic device of claim 1, wherein the first sealing portion comprises a connecting protrusion and a positioning flange; the connecting protrusion extends from a middle portion of the second sealing portion; the positioning flange is formed on an end of the connecting protrusion away from the second sealing portion.

3. The electronic device of claim 1, wherein the first housing further comprises a first bottom wall connecting with the first sidewall; the first sidewall comprises a first flange; the second housing further comprises a second bottom wall connecting with the second sidewall; the second sidewall comprises a second flange; the second sealing portion is disposed between the first flange and the second flange.

4. The electronic device of claim 3, wherein the first housing further comprises an engaging portion extending from the first bottom wall and adjacent to the first sidewall.

5. The electronic device of claim 1, wherein the first sealing member defines at least one guide groove in an inner surface, and at least one connecting hole in an outer surface, the at least one connecting hole communicating with the at least one guide groove.

6. The electronic device of claim 5, wherein the second sealing portion defines a first guide groove and a second guide groove in the inner surface, the first guide groove communicating with the first assembly groove, and the second guide groove communicating with the second assembly groove.

7. The electronic device of claim 1, further comprising a display and a second sealing member, the display being positioned on the first housing and the second sealing member attached to the first housing and covering the display.

8. The electronic device of claim 7, wherein the second sealing member is ultrasonically welded to the first housing.

9. The electronic device of claim 1, wherein a material of the first sealing member is plastic.

10. An electronic device, comprising: a first housing; a second housing; and a first sealing member positioned between the first housing and the second housing and comprising a first sealing portion and a second sealing portion, wherein the second sealing portion of the first sealing member defines at least one guide groove in an inner surface, and at least one connecting hole in an outer surface, the at least one connecting hole communicating with the at least one guide groove to guide water out of the electronic device.

11. The electronic device of claim 10, wherein the first sealing member further comprises at least one sealing plug engaging with the at least one connecting hole.

12. The electronic device of claim 10, further comprising a display and a second sealing member, the display being positioned on the first housing, and the second sealing member attached to the first housing and covering the display.

13. The electronic device of claim 12, wherein the second sealing member is ultrasonically welded to the first housing.

14. The electronic device of claim 10, wherein a material of the first sealing member is plastic.

\* \* \* \* \*